INVENTOR.
LEROY J. MILLER,
JOHN B. RUST,
BY Alton O. Oberholtzer
ATTORNEY.

INVENTORS.
LEROY J. MILLER,
JOHN B. RUST,
BY Alton V. Oberholtzer
ATTORNEY.

United States Patent Office 3,598,584
Patented Aug. 10, 1971

3,598,584
PHOTOPOLYMERIZATION PHOTOGRAPHY-REDUCTION OF INDUCTION PERIOD AND PRODUCT

John B. Rust, Los Angeles, and Leroy J. Miller, Canoga Park, Calif., assignors to Hughes Aircraft Company, Culver City, Calif.

Filed Oct. 3, 1966, Ser. No. 583,652
Int. Cl. G03c *1/68, 5/00;* G03f *7/10*
U.S. Cl. 96—35.1 5 Claims

ABSTRACT OF THE DISCLOSURE

A method for presensitizing a polymerizable photosensitive composition containing a photosensitive polymerization initiator capable of initiating mass polymerization of said photosensitive composition when irradiated with radiant energy, consisting of the step of uniformly irradiating said photosensitive composition with radiant energy and activating said catalyst for a time no longer than the induction period associated with visible mass polymerization of said polymerizable composition by said radiant energy.

The present invention relates to an improvement in the method of preparation for the formation of polymeric image impressions in photosensitive compositions and the products thereof. More specifically, the improvement concerns a method for presensitizing light-sensitive polymerizable compositions to permit more rapid formation of photopolymer images therein upon subsequent and momentary exposure of the photosensitive composition to information-bearing radiation.

It is well known that photopolymer images can be produced in photosensitive compositions containing polymerizable olefinic compounds as vinyl monomers and photosensitive polymerization initiators when such photosensitive compositions are continuously irradiated with radiant energy in a wavelength range capable of absorption by the polymerization initiators to produce free radicals capable of initiating polymerization of the vinyl monomers (hereinafter "actinic radiation" or "actinic light"). Irradiation by radiation of appropriate wavelength is generally continued until a visible photopolymer image of desired density is produced. The illumination time required to produce a photopolymer image of desired optical density varies with the characteristics of the components of each photosensitive composition. Heretofore, the time required to produce a photopolymer of given optical density has ranged from an order of magnitude of minutes with various prior art compositions to seconds with the photosensitive compositions, such as are described in copending applications of John B. Rust, each of which is entitled "Photopolymers and the Process of Making Same," Ser. No. 450,397, filed Apr. 23, 1965, and Ser. No. 483,986, filed Aug. 31, 1965, now abandoned and replaced by application Ser. No. 824,902 and Ser. No. 824,903, respectively, and each application being assigned to the instant assignee (herein designated as "said copending applications"). However, regardless of how rapidly a photopolymer image of given optical density can be formed in a particular photosensitive composition, such photopolymer image is generally not visually formed immediately upon exposure of the photosensitive composition to actinic radiation, that is, there is a time lag between the time when a discernible photopolymer mass is formed, a discernible photopolymer mass being one having a measurable optical density. This time lag is designated as the "induction time" or "induction period" and is characteristic of prior art photosensitive polymerizable compositions unless special procedures have been employed to eliminate the cause of such induction times. Thus, weak or temporary illumination of such photosensitive compositions with an image impression gives no appearance of polymerization and no apparent reproduction of the image.

Although the reactions resulting in induction periods are not fully understood, it is generally thought that the polymerization-initating free radicals, produced upon absorption of actinic radiation by polymerization initiators, are initially used up in reacting with inhibitors which are present in photosensitive compositions. Because of what appears to be a preference by the free radicals for the inhibitors over the polymerizable monomers, substantially no polymerization of the monomers occurs, or appears to occur, until substantially all of the inhibitor has been removed by reaction with free radicals. Since the induction time may be a substantial percentage of the total time required to produce a well defined photopolymer mass, it is necessary to remove the inhibitors where rapid polymerization is desired, or the subject is illuminated only momentarily for impression in the photosensitive composition.

Heretofore, elimination of the polymerization inhibitors has been attempted by physical means. For example, where the polymerization inhibitor is a gas, such as oxygen, the photosensitive composition is subjected to a vacuum or to purging with purified nitrogen. Such methods of eliminating inhibitors are costly and time consuming. Additionally, where photosensitive compositions are sealed between protective layers, it is practically impossible to remove the inhibitors by the prior art methods. Furthermore, since knowledge of polymerization inhibitors is not complete, unsuspected inhibitors may remain in the photosensitive compositions even after apparently thorough attempts at inhibitor removal by physical methods. If the inhibitors are not properly removed, then a considerable expenditure of the incident radiant energy with attendant loss in photopolymerization speed must be accepted.

Therefore, it would be advantageous to be able to effectively eliminate polymerization inhibitors, regardless of their characteristics, from a photosensitive composition to thereby accelerate photopolymer formation when said photosensitive composition is subsequently irradiated with a pattern of photopolymer-forming radiation. Such a a method would materially reduce the overall time required for photopolymerization and would insure the same results regardless of the nature or concentration of inhibitors present in the photosensitive composition.

In view of the foregoing, it is a major object of our invention to provide a method for initially deactivating inherent and any added polymerization inhibitors in photosensitive compositions, which method is affected by radiant energy and which can be employed with open or sealed photosensitive compositions without disturbing the subsequent photosensitivity thereof.

It is another object of our invention to provide an optical method for accurately reducing the induction period associated with any radiation employed for photopolymer image-forming purposes in photosensitive polymerizable compositions.

It is still another object of our invention to provide a method for deactivating or eliminating polymerization inhibitors in photosensitive compositions which enables subsequent polymerization and visible image formation to occur substantially instantaneously or more rapidly than was possible with prior art inhibitor removing methods, and the product obtained thereby.

It is a further object of our invention to provide a method for deactivating or eliminating the effect of polymerization inhibitors in photosensitive compositions, and the product thereof, which is readied for substantially instantaneous image reproduction radiation.

It is a still further object of our invention to provide a method for presensitizing photosensitive compositions containing a vinyl monomer and a photo-redox catalyst system with an initial or primary stage of irradiation to provide especially rapid polymerization processes when a subsequent image irradiation is impressed thereon by secondary irradiation, and the products obtained thereby.

Other objects and advantages will become apparent from the following description and from the drawings, in which.

Figure 1:
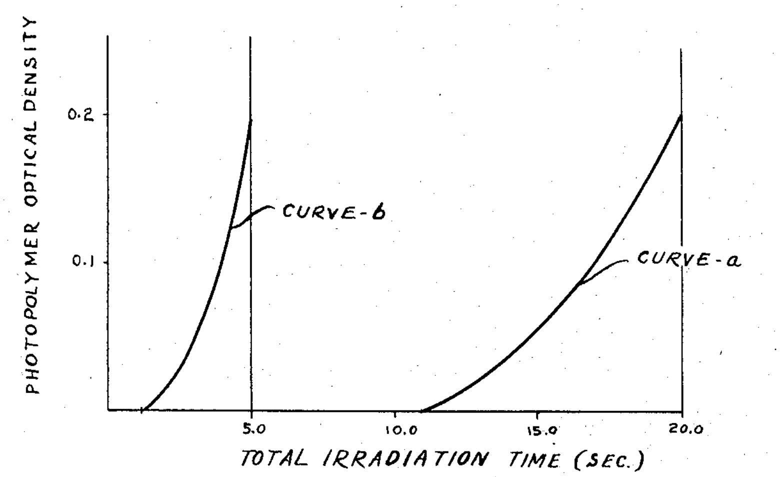
FIG. 1 is a graphical representation of the change in optical density of a photosensitive composition as a function of the total irradiation time, with and without presensitization, by the method of this invention.

In general, this invention comprises the method of uniformly irradiating a photosensitive composition containing a polymerization catalyst, for example, a vinyl monomer and a photosensitive polymerization initiator, with radiant energy capable of being absorbed by the polymerization initiator, for a time less than or equal to the induction period, and the product thereof. It will be understood that the induction period may vary for any particular photosensitive composition, depending upon the frequency and intensity of the radiant energy employed herein. Thus, as used herein, it will be understood that the term "induction period" is fixed by reference to the particular photosensitive composition employed and by the particular type of presensitizing radiant energy employed. The initial irradiation step will hereafter be designated "presensitizing step," and the ratio of presensitizing time to the induction period associated with the presensitizing radiation will be referred to as the "fractional reduction" in such induction period. A photopolymer mass or image may subsequently be produced in the presensitized photosensitive composition, whenever it is convenient to do so by any of the methods known to the art, as, for example, by the photopolymerization methods described in said copending applications. Preferably, the radiant energy employed in the presensitizing step is of relatively low intensity as compared with the intensity of the radiant energy employed in the photopolymer image-forming step to provide maximum control of the presensitizing step.

When a photosensitive composition is irradiated with actinic light for a time less than or equal to the induction period associated with such actinic light, the induction period is reduced by a fraction equal to the ratio of the irradiation time to the induction period. In addition, the sensitivity of the composition, surprisingly, appears to be increased and image desensitization time is shortened.

It has now been found that the fractional reduction in the induction period associated with the presensitizing radiation is equal to the fractional reduction of the induction period associated with any radiation employed for photopolymer image formation. Thus, the induction period associated with a second or subsequent image radiation source can be easily adjusted by controlling the induction period associated with the presensitizing radiation. Furthermore, in addition to reducing the induction period, the presensitizing step has been discovered to enhance the sensitivity of the polymerization reaction, that is, the rate of increase of photopolymer optical density, during the image-forming step, is much faster than the rate of increase of photopolymer optical density when no presensitizing step is employed. Further, desensitized presensitized compositions appear to better retain their photopolymer formed images.

As previously noted, all photosentsitive compositions containing a polymerizable monomer and a photosensitive polymerization initiator are characterized by the presence of inhibitors which, in turn, cause induction periods when such compositions are irradiated by actinic light. Therefore, the method of this invention can be employed with any such photosensitive compositions. For example, the photosensitive compositions which are described in U.S. Pats. Nos. 2,875,047 of Oster, and 3,255,004 and 3,259,499 of Thommes, and the like photosensitive compositions, respectively, may be employed with the methods of this invention. The disclosures of the above patents are incorporated herein by reference. Since the method of this invention is most useful when employed with photosensitive compositions which can be rapidly polymerized, it is preferable to use the photosensitive compositions of said co-pending applications which are incorporated herein by reference.

As previously noted, the induction period associated with the photopolymer-forming radiation can be accurately reduced by controlling the induction period associated with the presensitizing radiation. This can be shown by reference to FIG. 1 in which curve (*a*) represents a typical photopolymerization curve using prior art methods of polymerization and curve (*b*) represents a photopolymerization curve using the presensitizing method of this invention in conjunction with standard polymerization techniques. Data shown in FIG. 1 were obtained by first making a light-sensitive composition comprising:

"4 ml. of a solution of barium diacrylate prepared by combining 157.5 g. of barium hydroxide octahydrate, 157.5 ml. of water, and 72 ml. of acrylic acid; 1 ml. of an aqueous photocatalyst solution containing 2.14 g. of sodium p-toluenesulfinate dihydrate and 0.030 g. of methylene blue in 100 ml. of solution."

Films of the above mixture were prepared by sealing a portion of the mixture between two thin glass plates of about 2 x 4 inches separated 0.006 inch apart and fastening electrical tape about the perimeter so as to hold the solution in a central cavity between the plates surrounded by the tape.

In general, it may be stated that in treatment of the prepared films employing a light of intensity $I_0$ watts/cm.$^2$ it was found that the induction time was 10.8 seconds and that for a light of intensity $I_0/10$ watts/cm.$^2$ the induction period was 50.4 seconds. The light-sensitive composition was divided into parts (*a*) and (*b*) and part (*b*) was irradiated uniformly with light of intensity $I_0/10$ for 45 seconds, or 0.89 times the induction period associated with light of intensity $I_0/10$. During this irradiation no detectable polymerization or fogging occurred in the light-sensitive composition (*b*).

Each of the parts (*a*) and (*b*) was then irradiated with light of intensity $I_0$ watts/cm.$^2$ until a photopolymer image having an optical density of 0.2 was produced in each.

As can be seen from curve (*b*) of FIG. 1, the induction period associated with light of intensity $I_0$ was reduced to 1.2 seconds by pre-irradiation with light of intensity $I_0/10$. The normal induction period of 10.8 seconds associated with light of $I_0$ is shown by curve (*a*). Thus, it can be seen that the induction period associated with light of intensity $I_0$ was reduced by the fraction (10.8–1.2)10.8=0.89. This fraction is identical to the fractional reduction in the induction period associated with light of intensity $I_0/10$. This relation can be shown to exist for any other light intensities employed to polymerize a light-sensitive composition. Therefore, it can be seen that the reduction in the induction period associated with a photopolymer mass-forming light intensity can be directly controlled by an identical reduction in the induction period associated with the presensitizing radiation.

Thus, it will be understood that the induction time associated with developing radiation can be reduced to vanishingly small values to produce almost instantaneous polymerization.

Not only does the equivalence between the fractional reduction in the induction time associated with the presensitization radiation and the fractional reduction in induction time associated with the image-forming radiation hold for various radiation intensities, but it is also true for presensitization radiation of varying wavelengths. This can be seen from Table 1 and from FIG. 3 which are tabular and graphical representations of the data produced by the procedure and with the light-sensitive compositions described in the following example: in this example. Two films (one containing composition (*a*) and one containing composition (*b*) were not presensitized and therefore acted as references.

Figure 3:
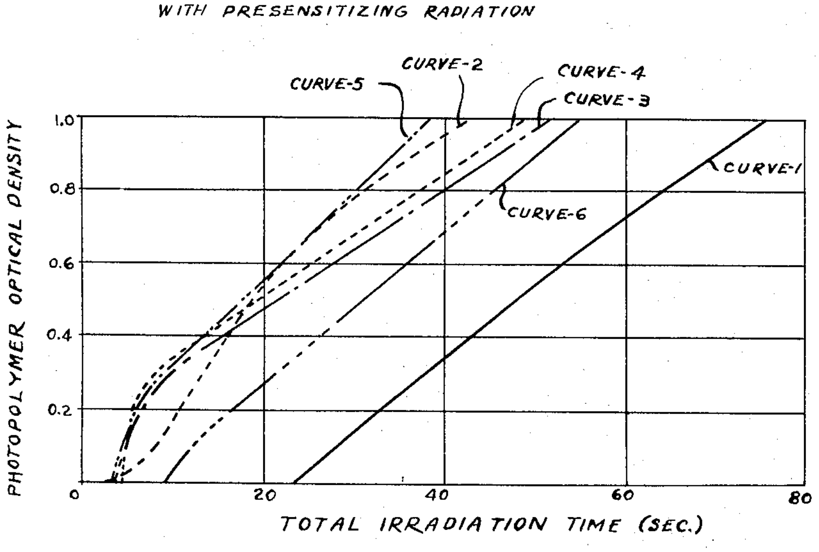
FIG. 3 is a graphical representation of the effect on the polymerization of a particular photosensitive composition of this invention illustrating changes in the wavelength of the presensitizing radiation.
Figure 4:
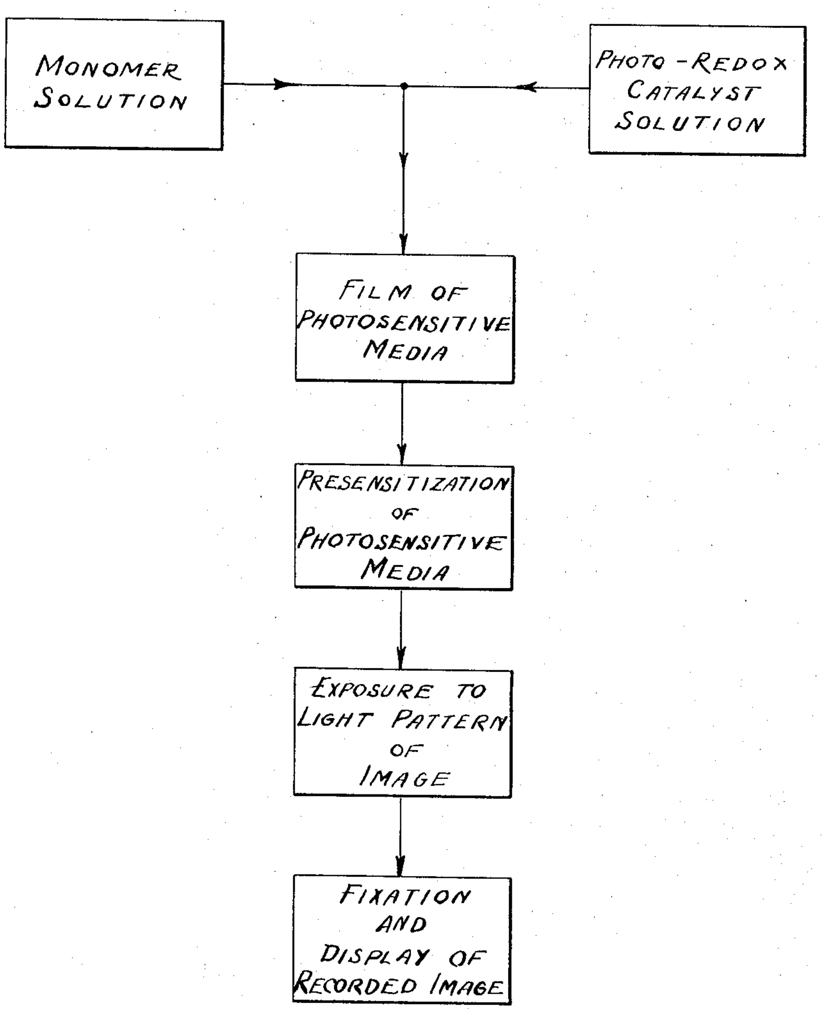
FIG. 4 is a diagrammatic illustration in block form demonstrating the process described herein with the preferred exemplary compositions.

The presensitized and non-presensitized photosensitive films were then exposed to white light having an intensity of 1.47×10 watts/cm. The new induction period was measured, as well as the times to achieve optical densities of 0.2, 0.4 and 1.0. Table 1 gives the results obtained by presensitization at different wavelength bands and FIG. 3 provides a graphical representation of the tabulated results for the composition (*a*) films. Curve 1 in FIG. 3 corresponds to data 6 in Table 1. Curve 2 is from data 1, curve 3 is from data 2, curve 4 from data 3 and curve 5 from data 4.

TABLE 1

| | | | Presensitization | | | Polymerization | | | |
|---|---|---|---|---|---|---|---|---|---|
| Photosensitive composition | | Presensitization color filter (passes) | Induction period (sec.) (1) | Time (sec.) (2) | Ratio (2)/(1) | Induction period (sec.) | Ratio (4)−(3)/(4) | Time to D=0.2 (sec.) | Time to D=1.0 (sec.) |
| *a*. Ba diacrylate 35% wt./vol | 1 | None (white) | 23 | 20 | 0.87 | 2 (3) | 0.91 | 11 | 43 |
| | 2 | Filtraflex (red) DT 98601 | 17 | 14 | 0.82 | 3 (3) | 0.87 | 7 | 52 |
| | 3 | Filtraflex (green) DT 98607 | 65 | 55 | 0.85 | 4 (3) | 0.83 | 6 | 49 |
| | 4 | Filtraflex (blue) DT 98610 | 240 | 232 | 0.97 | 3 (3) | 0.87 | 6 | 38 |
| | 5 | Corning (U.V.) CS 7-54 | ca. 28 | 17 | 0.61 | 9 (3) | 0.61 | 16.5 | 55 |
| | 6 | Non presensitized | | | | 23 (4) | | 33 | 76 |
| *b*. 0.8 M Ba diacrylate, 0.2 M Pb diacrylate 35% wt./vol. | 1 | None (white) | 8 | 6 | 0.75 | 2 (3) | 0.75 | 4 | 15 |
| | 2 | Filtraflex (red) DT 98601 | 6 | 4 | 0.67 | 4 (3) | 0.5 | 6 | 13 |
| | 3 | Filtraflex (green) DT 98607 | 40 | 35 | 0.88 | 35 (3) | 0.75 | 3 | 13 |
| | 4 | Filtraflex (blue) DT 98610 | 135 | 120 | 0.89 | 120 (3) | 0.75 | 4 | 11 |
| | 5 | Corning (U.V.) CS 7-54 | ca. 13 | 8 | 0.62 | 8 (3) | 0.63 | 5 | 14 |
| | 6 | Non presensitized | | | | 8 (4) | | 10 | 21 |

Two photosensitive compositions were prepared as follows:

Solution (a): 4 ml. of barium diacrylate monomer solution containing 35 percent wt./vol. of barium diacrylate in distilled water were added to 1 ml. of photocatalyst solution containing 2.14 grams sodium p-toluenesulfinate dihydrate and 0.030 gram of methylene blue dissolved in 100 ml. of distilled water. The mixture was prepared in the dark and stirred gently until homogeneous.

Solution (b): A monomer solution was prepared from 0.8 mole of barium diacrylate and 0.2 mole of lead diacrylate dissolved in distilled water to give a solution whose concentration of ingredients was 35 percent wt./vol. 4 ml. of this barium-lead diacrylate solution were added to 1 ml. of photocatalyst solution identical to that used in solution (a). The mixture was prepared in the dark and stirred gently until homogeneous.

A number of films of each solution were prepared by sealing the compositions between two thin glass plates separated 0.006 inch apart by a peripheral shim 6 mils thick. Each of the photosensitive compositions but two was preirradiated directly by white light or by passing white light of an arbitrary intensity through one of a series of inteference filters known to the trade as Filtraflex DT. The red filter passes wavelengths from about 5800 A. to beyond 8000 A. The green filter passes wavelengths between about 4800 A. and 6100 A. The blue filter passes wavelengths shorter than 4000 A. up to about 5200 A. To irradiate the photosensitive composition with ultraviolet light a filter known to the trade as Corning CS 7–54 and which passes ultraviolet radiation but absorbs visible light was used with a mercury arc ultraviolet source.

The induction period for each composition was measured for each filter and then a film of photosensitive composition was uniformly presensitized by exposure to the filtered light for a period less than the measured induction period. For the compositions employed, greatest photosensitivity is obtained by the use of red light and the least photosensitivity is obtained by the use of blue light. This photosensitivity spectrum corresponds to the light absorption characteristics of methylene blue used For each set of test conditions it will be seen that the fractional reduction in presensitization induction time (ratio) (2):(1), Table 1) is approximately equal to the fractional reduction in image-forming induction time (ratio [(4)–(3)]/(4), Table 1). For example, for (*a*)/5, the presensitization fractional reduction is 17/28=0.61. The slight variations from equivalency between the ratio (2):(1) and the ratio [(4)−(3)]/(4) of Table 1 are within the limits of experimental error.

From the foregoing it is apparent that any light or radiation which generates free radicals, or which light or radiation can initiate polymerization, is suitable for presensitizing the photopolymerizable composition, regardless of the intensity or wavelength of the presensitizing radiation. The presensitizing reduction in induction time is equal to the reduction in the induction period associated with the image-forming radiation. By using this identity the method of this invention permits accurate reduction of photopolymerization induction periods to provide rapid polymerization of light-sensitive compositions.

It has also been noted that presensitization by the method of this invention increases the rate of photopolymerization itself in the photopolymer mass-forming step. Again referring to FIG. 1, the slope of curve (*a*) illustrates a typical rate of photopolymerization without presensitization. Comparison of the slope of curve (*a*) (no presensitization) with the slope of curve (*b*) (presensitization) illustrates the effect on the rate of photopolymerization of presensitization or pre-irradiation. As shown by curve (*b*), pre-irradiation produces a sharp increase in the rate of polymerization. To reach the same photopolymer optical density of 0.2 without preirradiation (curve (*a*)), 9.2 seconds were required after the induction period, whereas a photopolymer optical density of 0.2 was produced with pre-irradiation after 3.8 seconds (curve (*b*)) following the induction period. This is an increase of 2.4 times in the polymerization rate using presensitization.

Theoretically, the induction period associated with the photopolymer image-forming radiation can be reduced to any desired value, including zero, by presensitizing for a time sufficient to reduce the induction period associated with the presensitizing radiation by a fraction equal to the fractional reduction in the image-forming induction period.

In practice, the aforementioned relationship between induction periods associated with presensitizing and image-forming radiation holds for irradiation in amounts up to that approaching the total energy required for complete removal of inhibitors. When the presensitizing energy is substantially equal to the amount of energy required to completely remove the inhibitor, e.g., above about 80% of the total energy requirement (depending upon photosensitive composition characteristics) the aforementioned relationship is no longer strictly correct.

The reasons for this phenomenon are believed to be very complex and are not presently fully understood. However, one of the reasons is that the induction period associated with any particular radiation is not a clearly defined period, that period, that is, the dividing line between inhibitor removal by free radicals and photopolymerization of the vinyl monomer by the free radicals is not always clearly defined. Thus, it may be difficult to determine precisely how long the induction periods are. This is especially true where the induction periods are relatively short, e.g., less than about 20 seconds. Therefore, when the induction period associated with the image-forming radiation is to be substantially reduced, it is preferable to initially irradiate for a time equal to about 80% to 95% of the induction period associated with the presensitizing radiation.

Figure 2:
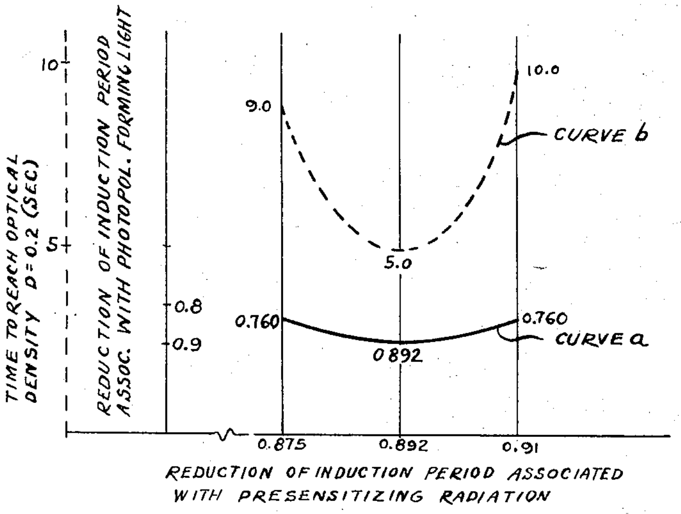
FIG. 2 is a graphical representation of the effect on photopolymerization of a photosensitive composition containing a vinyl monomer and a photo-redox catalyst system due to variations in the presensitization irradiation time.

The foregoing preference is graphically illustrated by FIG. 2. The data for FIG. 2 were obtained by first preparing test samples of photosensitive compositions containing 4 ml. of Solution A (an aqueous solution containing 35 percent wt./vol. of barium diacrylate) and 1 ml. of Solution B (an aqueous solution containing 2.14 grams of sodium p-toluenesulfinate dihydrate and 0.030 gram of methylene blue per 100 ml. of distilled water). Each test sample was irradiated with radiation having an intensity of $6.65\times10^{-5}$ watts/cm.$^2$ for varying periods of time less than the induction period associated with such radiation. Each test sample was then irradiated with light having an intensity of $6.65\times10^{-4}$ watts/cm.$^2$ to form a photopolymer mass. The changes in the induction period associated with the photopolymer-forming light and the times required to produce a photopolymer mass of optical density 0.2 were measured and these induction period changes and polymerization times, as functions of the change in the fractional reduction of the induction period associated with the presensitizing radiation, are represented by curves (*a*) and (*b*), respectively, in FIG. 2.

As shown in FIG. 2, as the fractional reduction in the induction period associated with the presensitizing radiation approaches unity (presensitizing time approaches the value of the induction period associated with the presensitizing radiation), curves (*a*) and (*b*) pass through an optimum range. For the photosensitive composition of this example, a presensitizing time which is about 90% of the induction period associated with the presensitizing radiation, optimally reduces the induction period associated with the photopolymer-forming light (curve (*a*)) and optimally reduces the time required to reach a particular optical density (0.2) (curve (*b*)).

The presensitizing radiation used in the method of this invention must have wavelengths capable of being absorbed by the photo-oxidant or dye in the photosensitive compositions to initiate polymerization of the vinyl monomer in the compositions, that is, presensitizing radiation is actinic radiation. Absorption of radiation by the photooxidant or dye in the presence of a photosensitive polymerization initiator produces free radicals capable of initiating polymerization of the vinyl monomers. However, these same free radicals preferentially react with the inhibitors present in the photosensitive compositions to produce an induction period. Thus, the wavelength absorption range of the photo-oxidant or dye will determine the wavelength range required for the presensitizing radiation. In general, the presensitizing radiation will have wavelengths lying in the wavelength region between about 2000 A. and about 7200 A. With the photosensitive compositions of said co-pending applications, the presensitizing radiation will have wavelengths lying between about 3800 A. and about 7200 A.

The intensity of the presensitizing radiation also lies within a wide range of intensities. However, it is preferable to employ presensitizing radiation having relatively low intensities as compared to the photopolymer mass forming radiation intensities. This preference results from the lack of sharp demarcation between the induction period and photopolymerization and from the better control of the presensitization time provided by low intensity radiation. By employing relatively low intensity presensitizing radiation, the presensitizing step can be stopped more easily and at a particular point than is possible when employing relatively high intensity radiation. Thus, with low intensity presensitizing radiation, the presensitizing time may more efficiently approach a value equal to the induction period and thereby prevent background fogging due to in advertent photopolymerization during the presensitizing step.

After a photosensitive composition has been presensitized by the method of this invention, it can be stored in the dark until it is desired to produce a photopolymer image in such photosensitive composition. Alternatively, the presensitized photosensitive composition may be immediately exposed to photopolymer image-forming radiation (actinic radiation) to produce a photopolymer image of any desired pattern.

After formation of a photopolymer image by photopolymerization of the vinyl monomer, the light-sensitive composition can be desensitized by any known method of desensitizing or fixing light-sensitive photopolymer compositions. Such fixing methods may be either physical or optical. For example, the light-sensitive components may be physically removed by washing the light-sensitive composition with solvents which dissolve the light-sensitive components, but which do not affect the photopolymer image. Fixing methods such as those described in copending applications to John B. Rust, "Photopolymer Fixation Process and Products," Ser. No. 583,649, now Pat. No. 3,531,281, Leroy J. Miller and John B. Rust, "Photopolymer Polymerization Fixation Process and Products," Ser. No. 583,650, now Pat. No. 3,531,282 and J. David Margerum, "Method of Inhibiting Photopolymerization and Products," Ser. No. 583,651, may also be used. Optical fixing methods are particularly useful where an entirely optical photopolymerization system is desired and where overall photopolymerization times are required to be as short as possible.

The photosensitive compositions preferably employed in conjunction with the method of this invention will now be described in some detail. In general, such photosensitive compositions are described in said copending applications and include, in combination: a vinyl monomer and a photo-redox catalyst system. The photo-redox catalyst system comprises (1) a photo-oxidant capable of being raised to a photoactive state by absorption of visible light having wavelengths lying between about 3800 A. and about 7200 A., and (2) a photoactivable catalyst selected from the group consisting of sulfinic, phosphine and arsine compounds as hereinafter described.

The polymerizable monomers will be designated by the term "vinyl monomers" which includes vinylidene monomers ($CH_2{=}CY_2$) and fluorocarbon monomers. Examples of vinyl monomers are butadiene, vinyl chloride, vinylidene chloride, vinyl methyl ether, vinyl butyl ether, vinyl butyrate, styrene, vinyl benzoate, methyl methacrylate, calcium diacrylate, barium diacrylate, acrylic acid, acrylonitrile and acrylamide. Monomers having a functionality greater than two may also be used where it is desirable to produce highly cross-linked polymers which are insoluble and infusible at a low degree of conversion. Use of cross-linking monomers permits formation of discernible images at lower radiation levels than can be produced in the same exposure period using light-sensitive compositions without cross-linking monomers. Such monomers may be employed in combination with monomers having a functionality of two or they may be used alone. Cross-linking monomers usable in our invention are typified by: N,N'-alkylenebisacrylamides, secondary acrylamides, tertiary acrylamides, di- or trivalent metal salts of acrylic or methacrylic acid, and the like.

The amount of vinyl monomer in the reaction medium can vary within extremely wide limits. On the one hand, the amount of monomer employed may be the maximum solubility of the particular monomer in a particular solvent. On the other hand, the monomer may be present in small molar concentrations of the order of $10^{-2}$ or $10^{-3}$ molar. Preferably, the concentration of the vinyl monomer is above about $2.5 \times 10^{-3}$ moles/liter. When a monomer having a functionality greater than two is employed in combination with a monomer having a functionality equal to two, the latter monomer is employed in an amount ranging from 10 to 50 parts per part of cross-linking agent.

Hereafter, the terms "moles per liter" and "molar" will be used to designate "moles per liter of photosensitive composition."

The specific photo-oxidants usable in the process of this invention are those disclosed in said co-pending applications and are incorporated hereinby reference. More specifically, they are members of the quinoidal dye family, such as phenothiazine dyes, phenazine dyes, acridine dyes, xanthene dyes, phenoxazine dyes and pyronine dyes.

The minimum required concentration of photo-oxidant of the photo-redox catalyst system is approximately $10^{-7}$ moles per liter. As the photo-oxidant concentration is increased above this minimum concentration, the sensitivity of the photopolymer composition does increase; however, the sensitivity may pass through a maximum as the photo-oxidant concentration is further increased so that it may be desirable to avoid high concentrations ($10^{-2}$ moles per liter or more), especially when the photosensitive solution to be polymerized is of greater thickness than a very thin film. However, since the optical properties of the photo-oxidant are dependent upon the quantities present as well as upon the intensity of the radiation employed, the criteria for determining the proper or practical quantities of photo-oxidant and of reducing agent to be employed will be governed by considerations other than just the amount needed for catalyzing the photo-polymerization reaction.

The catalysts of said co-pending applications are the organic sulfinic acids and derivatives thereof, the triorgano-substituted phosphines and the triorgano-substituted arsines. Only catalytic amounts of these catalysts are required for rapid photopolymerization of the vinyl monomer. Thus, photo-polymerization may be achieved in the method of this invention by employing concentrations of the catalyst as small as $1 \times 10^{-6}$ moles per liter. Higher concentrations, e.g., about $10^{-2}$ molar, may result in somewhat accelerated rates of photopolymerization.

The organic sulfinic compounds of said copending patent applications are the aromatic and aliphatic organic sulfinic acids and certain derivatives thereof. The derivatives of the organic sulfinic acids which can be employed are the salts, organic esters, sulfinyl halides and sulfinamides of the organic sulfinic acids. Each of these organic sulfinic compounds is characterized by its ability to form a free radical by giving up an electron to the photo-oxidant in its activated or photoactive state. In the free radical form, the organic sulfinic compounds are capable of initiating polymerization of the aforedescribed vinyl monomers.

Examples of organic sulfinic acids are: p-toluenesulfinic acid, benzenesulfinic acid, p-bromobenzenesulfinic acid, naphthalenesulfinic acid, 4-acetamidobenzenesulfinic acid, 5-salicylsulfinic acid, ethanesulfinic acid, 1,4-butanedisulfinic acid and α-toluenesulfinic acid. The salts of these acids may be any of the soluble salts which are compatible with the other components employed in the photosensitive solution and typically include the sodium salts, the potassium salts, the lithium salts, the magnesium salts, the calcium salts, the barium salts, the silver salts, the zinc salts and the aluminum salts. Appropriate esters of these acids typically include the methyl esters, the ethyl esters, the propyl esters and the butyl esters. The halogen derivatives of the organic sulfinic acids include the sulfinyl chlorides, for example, ethanesulfinyl chloride and benzenesulfinyl bromide. Examples of the organic sulfinamides are the sulfinamides such as ethanesulfinamide; the N-alkylsulfinamides, such as N-methyl-p-toluenesulfinamide; and the N-arylsulfinamides, such as N-phenylbenzenesulfinamide.

The triorgano-substituted phosphines and arsines or compounds thereof suitable for use in the practice of the present invention have the general formula:

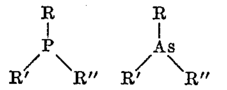

where R, R' and R'' may be alkyl, aryl, aralkyl or alkaryl groups.

As the triorgano-substituted phosphine or arsine for use in the present invention, we may employ, for example, such appropriate phosphine compounds as: tributylphosphine, triphenylphosphine, dibutylphenylphosphine, methyldiphenylphosphine and methylbutylphenylphosphine. Examples of appropriate triorgano-substituted arsine compounds are: triphenylarsine, methyldiphenylarsine, trioctylarsine, dibutylphenylarsine and methylbutylphenylarsine.

Only catalytic amounts of members of the sulfinic acid group, of the triorgano-substituted phosphine group and of the triorgano-substituted arsine group are needed with the photo-oxidants of said co-pending applications. Thus, photopolymerization may be achieved by using concentrations of these catalysts as small as $10^{-6}$ moles per liter.

In general, the light-sensitive composition is prepared by bringing together (a) a vinyl monomer and (b) a photosensitive polymerization initiator. When the photosensitive polymerization initiator comprises a photo-oxidant and a catalyst, the photosensitive initiator may first be made up and then added to the vinyl monomer, or either one of the initiator components may be added to the monomer and the resulting admixture then added to the other component of the polymerization initiator. Each of the components (a) and (b) is preferably added to the medium, such as a solution, before being mixed with the other component.

The photopolymerization process of the present invention is preferably carried out in a solution of the above components. The particular solvent employed will depend upon the solubility of the components (a) and (b). Thus, if all the components are water soluble, such as in a light-sensitive system employing, for example, acrylamide as the vinyl monomer, thionine as the photo-oxidant and sodium benzenesulfinate as the catalyst, an aqueous solution may be employed. Where a common solvent for the compounds is not available, different solvents which are miscible with each other may be employed. We have used as suitable solvents in the process of the present invention water, alcohols, such as methanol, glycerol and ethylene glycol, and dioxane.

Dispersions may also be used in effecting the presensitization and photopolymerization. Resort to dispersions may be had where it is desirable to use an insoluble monomer or photosensitive initiator system. In general, however, we prefer not to use dispersions since the particulate matter tends to scatter the light or radiation used in the photopolymerization process.

The following examples further illustrate the method and compositions of this invention and are not to be construed as placing limits upon the invention:

EXAMPLE 1

This example illustrates the substantial reduction in the time required for the photopolymerization reaction when a light-sensitive composition is presensitized. It further illustrates the use of a desensitizing agent, such as silver nitrate, in the light-sensitive composition to provide a rapid printing, readout and fixing system.

A photo-redox catalyst solution was made by dissolving 35 grams of 45 percent polyvinylpyrrolidone solution in 70 ml. of 0.1 molar solution of sodium p-toluenesulfinate. The solution was warmed and stirred until homogeneous. To 100 ml. of this solution there was added 0.083 gram of thionine and the resulting solution was warmed and stirred.

A photosensitive composition was prepared from the following component solutions:

2 ml. of barium diacrylate solution containing 0.5 gram of barium diacrylate per 1 ml. of solution;
½ ml. of the above photo-redox catalyst solution;
and ½ ml. of $10^{-2}$ molar silver nitrate solution.

The photosensitive composition was prepared in the dark and stirred until homogeneous. It was then placed between two thin glass plates having a peripheral spacer of 3 mil thick plastic sheet to give a film of the photosensitive medium .003 inch thick. The film of photosensitive material was exposed uniformly to the light from a 100-watt long wavelength ultraviolet bulb peaking at about 3660 A. The presensitization exposure time was for one minute.

The photosensitive, presensitized film was then exposed to a negative projected from a 100-watt projector for a period of 6 seconds. A very good print was obtained in this time. Without the presensitization exposure, it required 60 seconds to achieve a print of equal quality and density under the same light conditions. Both prints became permanently insensitive to light and fixed by storing in the dark for two hours.

An identical photosensitive composition was uniformly exposed to the same 100-watt long wavelength ultraviolet source but at about one-half the distance from the bulb and for a presensitization time of 30 seconds. The photosensitive, presensitized film was then exposed to a projected negative using a 100- watt projector and an exposure time of four seconds. An excellent print was secured. This represented a reduction from 60 seconds exposure time with a non-presensitized film to an exposure time of four seconds after presensitization to achieve the same quality and density of print. The print was fixed by heating in an oven at 80° C. for eight minutes, after which time it could be projected for an indefinite period with a 500-watt projector.

EXAMPLE 2

This example illustrates the effect of subjecting presensitized and non-sensitized, light-sensitive compositions to identical image-forming exposure and image fixing time. The light-sensitive solution in this example contained an ultraviolet-sensitive compound of the character described in the application of J. David Margerum, Ser. No. 583,-651, entitled "Method of Inhibiting Photopolymerization and Products," capable of temporarily desensitizing the light-sensitive composition after formation of a photopolymer image therein.

A monomer solution of barium diacrylate was prepared by adding 321 g. of barium hydroxide octahydrate to a solution of 144 g. of freshly distilled and recrystallized acrylic acid in 150 ml. of water. A small quantity of insoluble material was removed by filtration. The pH of the solution was 6.6.

A photosensitive solution was prepared by mixing 5.0 ml. of the monomer solution, 0.016 ml. of 0.056 molar aqueous methylene blue solution, 0.5 ml. of 0.1 molar aqueous sodium p-toluenesulfinate solution and 0.0147 g. of p-nitrophenylacetic acid.

Portions of the photosensitive solution were used to fill glass slide containers. These slides were prepared by fastening plastic tape with a thickness of about 6 mils to the perimeter of one surface of a glass plate, covering the center of the plate with the photosensitive solution and clamping a second glass plate on the top of the tape so as to hold the solution in a central cavity between the plates and surrounded by tape.

One slide prepared in this manner was presensitized by exposing it to ordinary room lighting containing some ultraviolet radiation for 24 sec. On other similar slides polymerization occurred after an exposure of about 27 sec. to light of this intensity. Light from a 200-watt super high pressure mercury lamp, known to the trade as PEK 200, was passed through a yellow filter, known to the trade as Corning CS 3–69, and an ordinary black and white negative, and the image of the negative was focused by means of lenses on the photosensitive solution. An exposure of 0.37 sec. was employed. This exposure was immediately followed by 0.58 sec. of irradiation with ultraviolet light from the same light source, the yellow filter and the negative being replaced by an ultraviolet transmitting, visible light absorbing filter, known to the trade as Corning CS 7–54.

Immediately following the ultraviolet exposure, which was used to fix the photopolymer image, the newly formed image was illuminated with visible light and projected onto a screen, the start of projection occurring 1.04 sec. after the start of the image-forming exposure. A good photopolymer image was obtained and it was projected for three minutes before deterioration in the quality of the image was noted at the edges and for nine minutes before the center of the picture was unsatisfactory for viewing.

An identical slide containing the photosensitive solution was exposed in the same manner to form, fix and project a photopolymer image except that there was no prior sensitization by exposure to room lighting. The exposure periods varied by no more than 0.03 sec. from those used for the presensitized slide. A very poor and incomplete photopolymer image was obtained. Only the center of the picture, which received the most intense illumination, was visible and this partial image deteriorated quickly to become indiscernible after being projected for 1½ min. The non-presensitized solution was not sufficiently sensitive to form a complete image in the allotted exposure time. The image was also inadequately fixed so that it deteriorated more rapidly upon subsequent exposure to visible light.

Thus, Example 2 shows that by using presensitization a photopolymer image of higher optical density is produced in the same image-forming exposure time and the time required for fixing is reduced.

Further, desensitizing agents incorporated in the photosensitive polymerizable composition, in the manner described in the above-mentioned applications and of the nature of pH control and heating, addition of a soluble silver salt and heating, or including such agents as 4-nitrophenylacetic acid, 4-nitrohomophthalic acid, 4,4′-dinitrodiphenylacetic acid, 2-(4′-nitrobenzyl) benzoic acid, 5-nitro-o-toluic acid and the soluble salts of such acids, including the higher molecular weight reaction products from photolysis of sodium 4-nitrohomophthalate, and the like, and ionizable derivatives thereof, and subsequent treatment after image formation with invisible radiation, as ultraviolet light, effected image fixation without change in the initial processing for presensitizing prepared films of the photosensitive polymerizable compositions.

EXAMPLE 3

This example illustrates the effect on induction times of variations in the light-sensitive compositions. More importantly, it illustrates the equivalence of the fractional reduction of the induction period associated with the presensitizing radiation and the fractional reduction in the induction period associated with the image-forming radiation, in spite of variations in the light-sensitive composition.

Several photosensitive compositions were prepared by admixing 4 ml. of barium lead diacrylate monomer solution having the compositions shown in Table 2, and 1 ml. of photocatalyst solution consisting of 2.14 grams of sodium p-toluenesulfinate dihydrate and 0.030 gram methylene blue in 100 ml. of distilled water.

The photosensitive compositions were placed between two thin glass plates spaced with a peripheral shim 6 mils thick, then sealed at the edges. The films were exposed to spots of light and the induction period and the time to obtain an optical density of 0.2 and of 0.4 were recorded. Other films were then uniformly exposed to light for a time less than the induction period and finally the presensitized films were exposed to light and their induction periods and time to obtain an optical density of 0.2 were recorded. Table 2 gives the results of these tests.

TABLE 2

| Proportions | | Presensitization time (sec.) | Induction period (sec.) | Time to D=0.2 (sec.) | Presensitization ligh intensity (watts/cm.²) | Imaging light intensity (watts/cm.²) |
|---|---|---|---|---|---|---|
| *a.* 0.9 M Ba diacrylate, 0.1 M Pb diacrylate, 35o/o wt./vol. | 1 | ----------- | 166 | 220 | --------------- | $6.65\times10^{-5}$ |
| | 2 | ----------- | 24 | 34 | --------------- | $6.65\times10^{-4}$ |
| | 3 | 150 | 3 | 6 | $6.65\times10^{-5}$ | $6.65\times10^{-4}$ |
| *b.* 0.9 M Ba diacrylate, 0.1 M Pb diacrylate, concentrated to 70o/o wt./vol. | 1 | ----------- | 58. 2 | 70 | --------------- | $6.65\times10^{-5}$ |
| | 2 | ----------- | 10. 8 | 15 | --------------- | $6.65\times10^{-4}$ |
| | 3 | 47. 4 | 1. 2 | 3 | $6.65\times10^{-5}$ | $6.65\times10^{-4}$ |
| *c.* 0.8 M Ba diacrylate, 0.2 M Pb diacrylate, 35o/o wt./vol. | 1 | ----------- | 41. 5 | 53 | --------------- | $6.65\times10^{-5}$ |
| | 2 | ----------- | 7 | 9 | --------------- | $6.65\times10^{-4}$ |
| | 3 | 39 | 0. 5 | 2 | $6.65\times10^{-5}$ | $6.65\times10^{-4}$ |

The fractional reduction in the induction period during the presensitizing step in (a) is 150/166=0.90. The fractional reduction in induction period associated with the image-forming step in (a) is (24−3)/24=0.88. The corresponding values for compositions (b) and (c) are 0.82 and 0.89, and 0.94 and 0.93, respectively. These values may be taken as equal since the differences are within the limits of experimental error. Thus, it is apparent from these values that the induction period associated with the image-forming exposure can be readily controlled by reducing the induction period associated with the presensitizing radiation.

From the foregoing description and examples, it will be understood that we have disclosed a novel method for presensitizing photosensitive compositions, which method permits rapid production of photopolymer masses of desired optical density in a subsequent photopolymer mass-forming step. Because an induction period is associated with all photopolymerization processes, the method of this invention finds utility in conjunction with such processes. However, for rapid photopolymerization it is preferable to employ the photosensitive compositions of said copending applications.

The herein-described presensitization method is a completely optical method and does not require any extraneous agents. Presensitization is effected by uniformly irradiating a photosensitive composition with actinic radiation for a period less than or equal to the induction period associated with such actinic radiation. The presensitizing time is determined by the desired reduction in the induction period associated with subsequently-employed photopolymer-forming radiation. That is, in general, the fractional reduction in the induction period associated with the presensitizing radiation is equal to the fractional reduction in the induction period associated with the photopolymer-forming radiation. However, some deviation from this relation does exist where the intended reduction in the induction period is substantially equal to the induction period. When this situation occurs, it is desirable to optimize the amount of presensitizing radiation as herein described.

The wavelengths of the presensitizing radiation are those wavelengths which can be absorbed by the photosensitive composition to generate free radicals or initiate polymerization of the vinyl monomer. The intensity of the presensitizing radiation may be of any magnitude; however, it is preferable to employ relatively low intensity radiation to obtain maximum control over the presensitization step and thereby prevent inadvertent polymerization.

After a photosensitive composition is presensitized, it may be immediately irradiated with photopolymer-forming radiation or it may be stored in the dark for future use.

While certain embodiments are disclosed herein, modifications which lie within the scope of this invention will occur to those skilled in the art. We intend to be bound only by the scope of the claims which follow.

What is claimed is:

1. A method of reduction of normal polymerization time and producing a photopolymer image in a photosensitive photopolymerizable material containing vinyl monomers in admixture with a light activable photo-redox catalyst system capable of effecting the generation of free radical polymerization of said vinyl monomers in the actinic light range of about 3800 A. to about 7200 A., said method comprising the steps of:

(A) providing a supported film of a photosensitive photopolymerizable composition comprising:

(1) an addition polymerizable ethylenically unsaturated composition capable of forming a high polymer by free-radical initiated, chain-propagating addition polymerization containing vinyl monomers in combination with (2) a free-radical generating photo-oxidant catalyst addition polymerization initiator combination activable by radiation having wavelengths in the range of between about 3800 A. and about 7200 A. comprising a light absorptive quinoidal dye compound and a catalyst compound selected from the class consisting of aromatic or aliphatic organic sulfinic acid compound, including the salt, organic ester, sulfinyl halide and sulfinamide derivative form thereof, or alkyl, aryl, aralkyl or alkaryl organic phosphine, or alkyl, aryl, aralkyl or alkaryl organic arsine, said catalyst being characterized by being capable of reacting with the light excited form of said dye compound to generate said free radical initiator;

(B) initially uniformly irradiating said photosensitive composition with actinic radiant energy and activating said photo-redox catalyst system for a time less than the induction period associated with said actinic radiant energy to thereby presensitize said catalyst system in said photosensitive composition;

(C) further irradiating said presensitized photosensitive composition with actinic radiant energy through a pattern for a time less than or equal to the induction period of said actinic radiant energy but of sufficient duration to produce a visible photopolymer image of said pattern of desired optical density in the area of said film which was irradiated during the pattern irradiation step, and thereafter (D) physically or optically desensitizing photopolymerization of said photosensitive photopolymerizable by the single additional step from the group consisting of (1) heating the said film in the presence of an ingredient which prevents any further photopolymerization of the said composition, (2) storing the said film in the dark in the presence of an ingredient which prevents any further photopolymerization of the said composition, (3) adjusting the pH of the said composition and heating the said film in the presence of an ingredient which prevents any further photopolymerization of the said composition, or (4) uniformly irradiating said film with ultraviolet radiation which is not actinic radiation for said photopolymerizable composition in the presence of an ingredient which temporarily prevents any further photopolymerization of the said composition.

2. The method of claim 1 wherein said radiant energy employed in said initial irradiation step is of a relatively low intensity as compared with said radiant energy employed in the patterned irradiation step.

3. The method of claim 1 wherein said actinic radiant energy employed in said initial irradiation step has the same wavelengths as said actinic radiant energy employed in the patterned irradiation step.

4. The method of claim 1 wherein said actinic radiant energy employed in said initial irradiation step has wavelengths differing from the wavelengths present in said actinic radiant energy employed in the patterned irradiation step.

5. The method of claim 1 wherein said photosensitive composition contains, in addition, a desensitizing agent capable of inactivating said photo-oxidant when irradiated with radiant energy having wavelengths lying in a wavelength range differnig from the wavelength range of said actinic radiant energy, said desensitizing agent selected from the group consisting of 4-nitrophenylacetic acid, 4-nitrohomophthalic acid, 4,4′-dinitrodiphenylacetic acid, 2-(4′-nitrobenzyl) benzoic acid, 5-nitro-o-toluic acid and the soluble salts of such acids, including the higher molecular weight reaction products from photolysis of sodium-4-nitrohomophthalate, and ionizable derivatives thereof, said photosensitive composition containing water in amount sufficient to ionize said desensitizing agent and wherein said desensitizing step comprises irradiating said photosensitive composition with radiant energy having wavelengths lying in a wavelength range differing from the wavelength range of said actinic radiant energy.

References Cited

UNITED STATES PATENTS

| | | | |
|---|---|---|---|
| 2,875,047 | 2/1959 | Oster | 96—35.1 |
| 2,989,455 | 6/1961 | Neugebauer et al. | 204—159.23 |
| 3,047,422 | 7/1962 | Sites et al. | 96—115X |
| 3,050,390 | 8/1962 | Leuinos | 96—35.1 |
| 3,097,096 | 7/1963 | Oster | 96—35.1X |
| 3,144,331 | 8/1964 | Thommes | 96—115X |
| 3,352,772 | 11/1967 | Mao | 204—159.24 |
| 3,331,761 | 7/1967 | Mao | 204—159.23 |

NORMAN G. TORCHIN, Primary Examiner

C. L. BOWERS Jr., Assistant Examiner

U.S. Cl. X.R.

96—45.2, 48, 115